(12) United States Patent
Cha et al.

(10) Patent No.: US 12,439,758 B2
(45) Date of Patent: Oct. 7, 2025

(54) WAFER HAVING AUXILIARY PATTERN FOR ALIGNING LIGHT EMITTING DEVICE AND METHOD OF FABRICATING UNIT PIXEL USING THE SAME

(71) Applicant: SEOUL VIOSYS CO., LTD., Gyeonggi-do (KR)

(72) Inventors: Namgoo Cha, Gyeonggi-do (KR); Seongchan Park, Gyeonggi-do (KR); Jae Hee Lim, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 816 days.

(21) Appl. No.: 17/495,451

(22) Filed: Oct. 6, 2021

(65) Prior Publication Data
US 2022/0115437 A1    Apr. 14, 2022

Related U.S. Application Data

(60) Provisional application No. 63/089,610, filed on Oct. 9, 2020.

(51) Int. Cl.
| | | |
|---|---|---|
| *H10H 29/14* | (2025.01) | |
| *H01L 25/075* | (2006.01) | |
| *H10H 20/01* | (2025.01) | |
| *H10H 20/857* | (2025.01) | |

(52) U.S. Cl.
CPC .......... *H10H 29/142* (2025.01); *H10H 20/01* (2025.01); *H10H 20/857* (2025.01); *H10H 20/036* (2025.01)

(58) Field of Classification Search
CPC ..... H10K 50/18; H01L 27/156; H01L 33/005; H01L 33/62; H01L 27/56; H01L 2924/12041; H01L 25/073; H10H 29/142; H10H 20/01; H10H 20/857
See application file for complete search history.

(56) References Cited

U.S. PATENT DOCUMENTS

| | | | |
|---|---|---|---|
| 11,961,872 B2 * | 4/2024 | Cha | H01L 25/0753 |
| 2017/0025399 A1 * | 1/2017 | Takeya | H01L 33/0093 |
| 2017/0045779 A1 * | 2/2017 | Kamiyoshihara | G02F 1/133608 |
| 2018/0151780 A1 * | 5/2018 | Jang | H01L 33/22 |

(Continued)

FOREIGN PATENT DOCUMENTS

| | | |
|---|---|---|
| KR | 1020180022683 A | 3/2018 |
| KR | 1020180097979 A | 9/2018 |

(Continued)

OTHER PUBLICATIONS

International Search Report issued in corresponding International Application No. PCT/KR2021/013863, English Translation, mailed Jan. 24, 2022, 3 pages.

*Primary Examiner* — Alonzo Chambliss
(74) *Attorney, Agent, or Firm* — Perkins Coie LLP

(57) ABSTRACT

A wafer for fabricating a unit pixel is provided. The wafer includes a transparent substrate, and a light blocking layer disposed on the transparent substrate. The light blocking layer includes a plurality of unit pixel regions and at least one observation region. Each of the unit pixel regions has a mounting region for mounting a light emitting device, and the observation region includes the mounting region for mounting the light emitting device and an auxiliary pattern disposed around the mounting region.

19 Claims, 13 Drawing Sheets

(56) References Cited

U.S. PATENT DOCUMENTS

2019/0157519 A1   5/2019  Jung et al.
2020/0350464 A1*  11/2020  Shin .................... H01L 33/0095
2021/0343782 A1*  11/2021  Cha ...................... H01L 25/167

FOREIGN PATENT DOCUMENTS

KR   1020190026617 A   3/2019
KR   1020190053500 A   5/2019

* cited by examiner

WAFER HAVING AUXILIARY PATTERN FOR ALIGNING LIGHT EMITTING DEVICE AND METHOD OF FABRICATING UNIT PIXEL USING THE SAME

CROSS-REFERENCE OF RELATED APPLICATION AND PRIORITY

The Present Application is a Non-provisional Application which claims priority to and benefit of U.S. Provisional Application No. 63/089,610 filed Oct. 9, 2020, the disclosure of which is incorporated by reference as if fully set forth herein.

TECHNICAL FIELD

Exemplary embodiments relate to a wafer having an auxiliary pattern for aligning light emitting devices and a method of fabricating a unit pixel using the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response, than conventional light sources, and thus, the light emitting diodes have been replacing the conventional light sources.

The conventional light emitting diodes have been generally used as backlight light sources in displaying apparatuses. Displaying apparatuses that directly realize images using the light emitting diodes have been recently developed. Such displays are also referred to as micro LED displays.

In general, the displaying apparatus displays various colors through mixture of blue, green, and red light. In order to realize various images, the displaying apparatus includes a plurality of pixels, each including sub-pixels corresponding to one of blue, green, and red light. As such, a color of a certain pixel is typically determined based on the colors of the sub-pixels, so that images can be realized through the combination of such pixels.

In the case of the micro LED display, a micro LED is arranged on a two-dimensional plane corresponding to each sub pixel, and, accordingly, a large number of micro LEDs need to be arranged on a single substrate. The micro LED is extremely small, for example, 200 µm or less, further 100 µm or less, and these small sizes cause various technical complexities. In particular, it is complicated to handle light emitting diodes having small sizes, and thus, it is not easy to directly mount the light emitting diodes on a display panel. Moreover, among a large number of micro LEDs mounted on the display panel, a defect may occur in one or more of the mounted micro LEDs. It may not be straightforward to repair the defective micro LEDs on the display panel, and the defective display panel may not be used.

SUMMARY

A method of fabricating a display may be used, in which a plurality of unit pixels is manufactured by cutting a wafer on which micro LEDs are mounted as individual units, and the unit pixels are mounted on a circuit board. For example, unit pixels may be provided by mounting light emitting devices in each unit pixel region of a transparent substrate having a plurality of unit pixel regions, and then dividing the unit pixel regions. An adhesive layer is provided on the transparent substrate, and the light emitting devices may be attached on the wafer by the adhesive layer.

According to the method, a displaying apparatus may be manufactured by selecting unit pixels in which micro LEDs are favorably mounted and mounting these unit pixels on a display panel. As it is easy to handle the unit pixels and the favorable unit pixels are used, a yield of the display panel may be improved. Furthermore, as unit pixels having potentially defective micro LEDs may be unused, it is possible to reduce cost loss due to a mounting failure of micro LEDs.

To save processing time, the micro LEDs are transferred in a group using a transferring process on the wafer. At this time, it is necessary to check whether the micro LEDs are properly mounted in correct locations on the wafer. When the micro LEDs deviate from the correct locations, degrees of deviation are detected and the mounting locations of the micro LEDs are adjusted in a next transferring process.

As sizes of the micro LEDs decrease, it is desirable to control the locations of the micro LEDs. determine the degrees of deviation of the micro LEDs from their correct locations in case of a shape deformation of the adhesive layer to which the micro LEDs are attached.

Exemplary embodiments provide a wafer for fabricating a unit pixel for a display, on which light emitting devices can be easily aligned and degrees of deviation of light emitting devices from correct locations can be easily measured.

Exemplary embodiments provide a method of fabricating a unit pixel capable of precisely measuring locations of unit pixels even when an adhesive layer is deformed.

An exemplary embodiment provides a wafer for fabricating a unit pixel. The wafer includes a transparent substrate, and a light blocking layer disposed on the transparent substrate. The light blocking layer includes a plurality of unit pixel regions and at least one observation region, each of the unit pixel regions has a mounting region for mounting a light emitting device, and the observation region includes a mounting region for mounting the light emitting device and an auxiliary pattern disposed around the mounting region.

An exemplary embodiment provides a method of fabricating a unit pixel, the method including steps of preparing a transparent substrate, forming a light blocking layer including a plurality of unit pixel regions and at least one observation region on the transparent substrate, forming an adhesive layer covering the light blocking layer, and mounting light emitting devices on the adhesive layer to correspond to the unit pixel regions and the at least one observation region. Each of the unit pixel regions has a mounting region for mounting a light emitting device, and the observation region includes a mounting region for mounting the light emitting device and an auxiliary pattern disposed around the mounting region.

DESCRIPTION OF DRAWINGS

FIG. 5A shows forming a concave-convex pattern on an upper surface of a transparent substrate;

FIG. 5B shows forming a light blocking layer on the transparent substrate;

FIG. 5C shows forming an adhesive layer on the light blocking layer;

FIG. 5D shows forming a step adjustment layer to cover light emitting devices; and FIG. 5E shows forming connection layers on the step adjustment layer.

DETAILED DESCRIPTION OF THE ILLUSTRATED EMBODIMENTS

Figure 1:
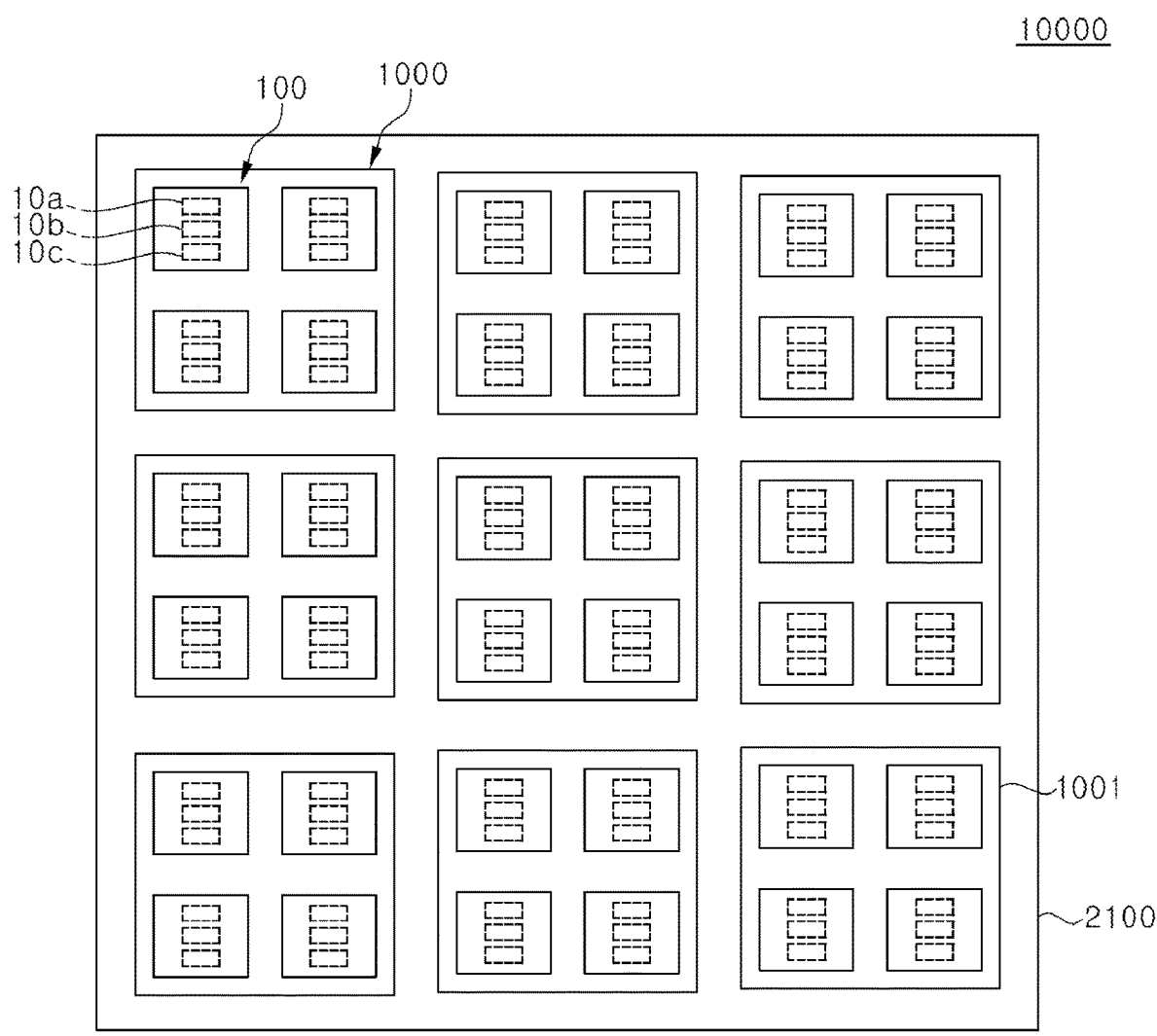
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A wafer according to an exemplary embodiment is a wafer for fabricating a unit pixel, the wafer including: a transparent substrate; and a light blocking layer disposed on the transparent substrate, in which the light blocking layer includes a plurality of unit pixel regions and at least one observation region, each of the unit pixel regions has a mounting region for mounting a light emitting device, and the observation region includes a mounting region for mounting the light emitting device and an auxiliary pattern disposed around the mounting region.

By disposing the auxiliary pattern, a mounting location of the light emitting device may be adjusted using the auxiliary pattern, and further, a degree of deviation of the mounted light emitting device from a correct location may be precisely measured.

In at least one variant, the light blocking layer may include a plurality of observation regions disposed adjacent to one another.

In another variant, by disposing the observation regions adjacent to one another, it is possible to precisely mount the light emitting devices in the correct locations.

In an exemplary embodiment, the observation regions adjacent to one another may have different auxiliary patterns from one another. In another exemplary embodiment, the observation regions adjacent to one another may have an identical auxiliary pattern to one another. In an exemplary embodiment, at least two of the observation regions adjacent to one another may have different auxiliary patterns from one another.

In further another variant, the wafer may further include an adhesive layer covering the light blocking layer; and light emitting devices disposed on the adhesive layer, in which the adhesive layer may cover the plurality of pixel regions and the at least one observation region, and the light emitting devices may be disposed on the light emitting device mounting regions of the unit pixel regions and the observation regions of the light blocking layer.

In another variant, the unit pixel regions and the observation region may include three light emitting device mounting regions, respectively.

In another variant, the unit pixel regions may include windows respectively corresponding to the three light emitting device mounting regions.

In another variant, the observation region may include windows corresponding to the three light emitting device mounting regions or islands of the light blocking layer.

In another variant, the auxiliary pattern may be formed of a line formed in intaglio or embossing.

In another variant, the auxiliary pattern may include islands of the light blocking layer disposed adjacent to the light emitting device regions.

In another variant, the at least one of the plurality of unit pixel regions include three windows respectively corresponding to the three light emitting device mounting regions.

In another variant, the observation region includes three windows corresponding to the three light emitting device mounting regions or island patterns from the light blocking layer.

In another variant, the auxiliary pattern further includes island structures patterned from the light blocking layer and disposed adjacent to the second mounting region.

A method of fabricating a unit pixel according to an exemplary embodiment includes: preparing a transparent substrate, forming a light blocking layer including a plurality of unit pixel regions and at least one observation region on the transparent substrate, forming an adhesive layer covering the light blocking layer, and mounting light emitting devices on the adhesive layer to correspond to the unit pixel regions and the at least one observation region, in which each of the unit pixel regions has a mounting region for mounting a light emitting device, and the observation region includes a mounting region for mounting the light emitting device and an auxiliary pattern disposed around the mounting region.

In another variant, in the method of fabricating the unit pixel, a plurality of light emitting devices may be transferred together to and mounted on the unit pixel regions and the observation region.

In another variant, the method of fabricating the unit pixel may further include adjusting locations of the light emitting devices using the auxiliary pattern before the light emitting devices are mounted.

In another variant, the method of fabricating the unit pixel may further include measuring degrees of deviation of the light emitting devices from correct locations by using the auxiliary pattern after the light emitting devices are mounted.

In another variant, the method of fabricating the unit pixel may further include forming a step adjustment layer covering the light emitting devices, and forming connection layers connected to the light emitting devices on the step adjustment layer.

In another variant, the method of fabricating the unit pixel may further include dividing the transparent substrate corresponding to the unit pixel regions.

In another variant, the light blocking layer may include a plurality of observation regions adjacent to one another.

In another variant, the adjacent observation regions may have different auxiliary patterns from one another.

In another variant, at least two of the adjacent observation regions may have different auxiliary pattern from one another.

In another variant, the auxiliary pattern may include a line formed in intaglio or embossing.

In another variant, the auxiliary pattern may include islands of the light blocking layer disposed adjacent to the light emitting device regions.

In another variant, forming an auxiliary pattern further comprises forming island patterns from the light blocking layer such that the island patterns are disposed adjacent to the second mounting region.

Hereinafter, exemplary embodiments will be described in detail with reference to the accompanying drawings FIG. 1 is a schematic plan view illustrating a displaying apparatus according to an exemplary embodiment.

Referring to FIG. 1, a displaying apparatus 10000 may include a panel substrate 2100 and a plurality of pixel modules 1000.

The displaying apparatus 10000 is not particularly limited, but it may include a virtual reality (VR) displaying apparatus such as a micro LED TV, a smart watch, a VR headset, or an augment reality (AR) displaying apparatus such as augmented reality glasses.

The panel substrate 2100 may include a circuit for a passive matrix driving or active matrix driving manner. In an exemplary embodiment, the panel substrate 2100 may include wirings and resistors therein, and, in another exemplary embodiment, the panel substrate 2100 may include wirings, transistors, and capacitors. The panel substrate 2100 may also have pads that are capable of being electrically connected to the disposed circuit on an upper surface thereof.

In an exemplary embodiment, the plurality of pixel modules 1000 are arranged on the panel substrate 2100. Each of the pixel modules 1000 may include a circuit board 1001 and a plurality of unit pixels 100 disposed on the circuit board 1001. In another exemplary embodiment, the plurality of unit pixels 100 may be arranged directly on the panel substrate 2100.

In some forms, each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line, as illustrated in FIG. 1. In an exemplary embodiment, the light emitting devices 10a, 10b, and 10c may be arranged in a vertical direction with respect to a display screen on which an image is implemented. However, the inventive concepts are not limited thereto, and the light emitting devices 10a, 10b, and 10c may be arranged in a lateral direction with respect to the display screen on which the image is implemented.

When the light emitting devices 10a, 10b, and 10c are mounted directly on the panel substrate 2100, a mounting failure of the light emitting devices difficult to handle is likely to occur. In this case, since all of the light emitting devices and the panel substrate 2100 need to be discarded, a significant cost loss may occur. On the contrary, by first manufacturing the unit pixel 100 on which the light emitting devices 10a, 10b, and 10c are mounted, and then selecting favorable unit pixels 100 and mounting them on the panel substrate 2100, cost loss may be reduced.

Hereinafter, each element of the displaying apparatus 10000 will be described in detail in an order of the light emitting devices 10a, 10b, and 10c, the unit pixel 100, and the pixel module 1000 disposed in the displaying apparatus 10000.

Figure 2A:
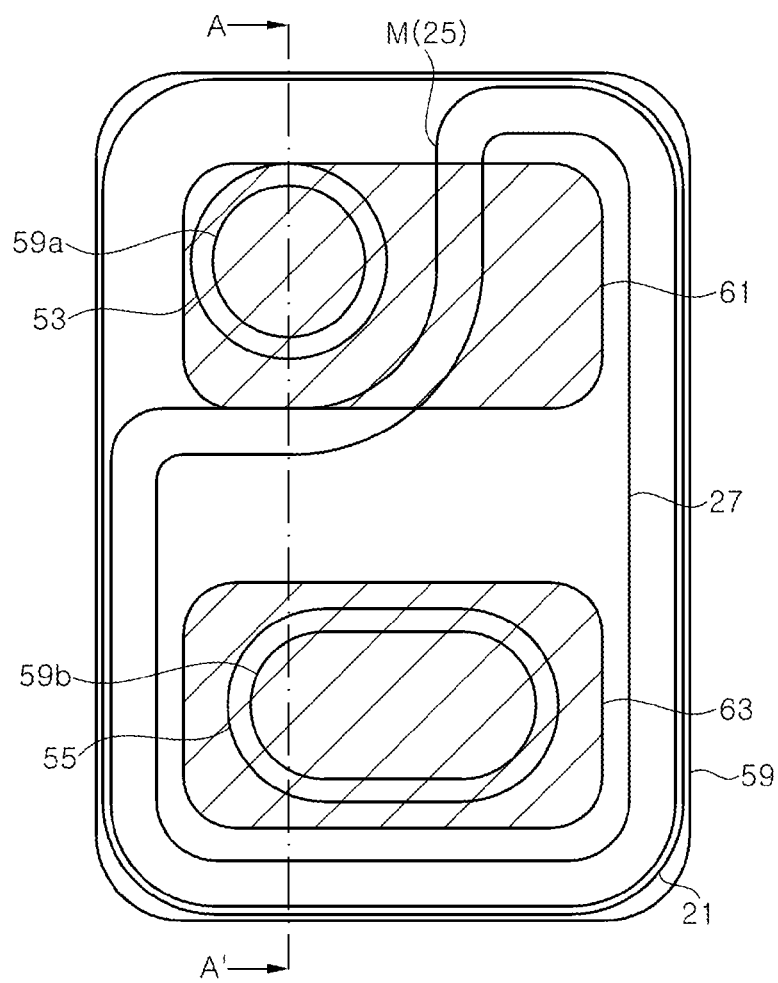
FIG. 2A is a schematic plan view illustrating a light emitting device according to an exemplary embodiment.
Figure 2B:
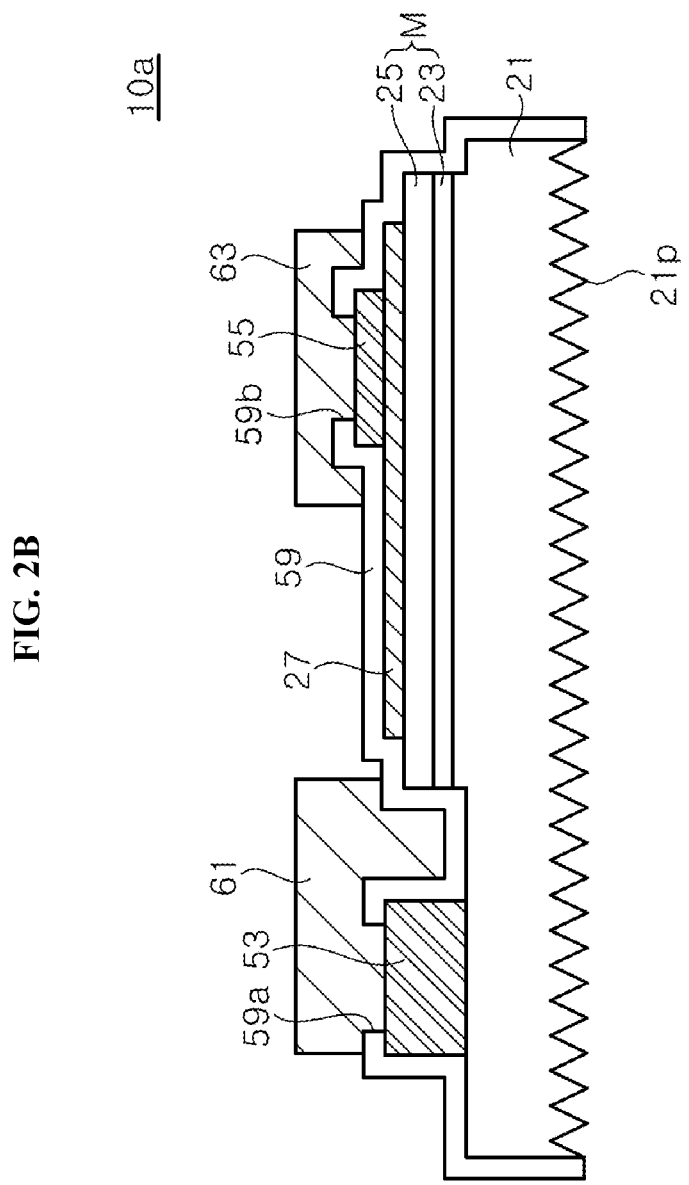
FIG. 2B is a schematic cross-sectional view taken along line A-A' of FIG. 2A.

First, FIG. 2A is a schematic plan view illustrating the light emitting device 10a according to an exemplary embodiment, and FIG. 2B is a schematic cross-sectional view taken along line A-A' of FIG. 2A. Herein, the light emitting device 10a is exemplarily described, but since the light emitting devices 10b and 10c have a substantially similar structure to that of the light emitting device 10a, repeated descriptions thereof will be omitted.

Referring to FIGS. 2A and 2B, the light emitting device 10a may include a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting device 10a may have a rectangular shape having a major axis and a minor axis in plan view. For example, a length of the major axis may have a size of about 100 μm or less, and a length of the minor axis may have a size of about 70 μm or less. The light emitting devices 10a, 10b, and 10c may have substantially similar shapes and sizes.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In an exemplary embodiment, in a case of the light emitting device 10a emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of the light emitting device 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in a case of the light emitting device 10c emitting blue light, the semiconductor layers may include gallium nitride (GaN), indium gallium nitride (InGaN), or zinc selenide (ZnSe).

The first conductivity type and the second conductivity type have opposite polarities, such as when the first conductivity type is an n-type, the second conductivity type becomes a p-type, or, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as Metal Organic Chemical Vapor Deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 2A-2B, these layers may be multiple layers, and may also include a superlattice layer. The active layer 23 may include a single quantum well structure or a multiple quantum well structure, and a composition ratio of a Nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 2B. The mesa M is located on a partial region of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21 around it. In another exemplary embodiment, a through hole may be formed through the mesa M to expose the first conductivity type semiconductor layer 21.

Meanwhile, the first conductivity type semiconductor layer 21 may have a concave-convex pattern 21p by surface texturing. The concave-convex pattern 21p may be formed on a light exiting surface of the first conductivity type semiconductor layer 21. Surface texturing may be carried out by patterning, for example, using a dry or wet etching process.

In an exemplary embodiment, cone-shaped protrusions may be formed, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

In another exemplary embodiment, the concave-convex pattern 21p may include a first concave-convex pattern and a second concave-convex pattern additionally formed on the first concave-convex pattern.

Since the concave-convex pattern is formed on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10a, 10b, and 10c, and thus, viewing angles of light emitted from the first, second, and third light emitting devices 10a, 10b, and 10c may become uniform. However, the inventive concepts are not limited thereto, and the light emitting devices 10a, 10b, and 10c may have different concave convex patterns from one another, or some of the light emitting devices may have a flat surface without including the concave-convex pattern 21p.

Referring back to FIGS. 2A and 2B, the ohmic contact layer 27 is disposed on and in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. Alternatively, the first contact pad 53 may be omitted.

The second contact pad 55 may be disposed on the ohmic contact layer 27. The second contact pad 55 is electrically connected to the ohmic contact layer 27. The second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed of a single layer or multiple layers. The insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than that for light incident at the incident angle of 0 degrees.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10b. For example, the distributed Bragg reflector formed in the blue light emitting device 10c may have a reflectance of 95% or less at the incident angle of 0 degrees for blue light generated in the active layer 23, and further 90% or less, the distributed Bragg reflector formed in the green light emitting device 10b may have a reflectance of about 95% or more and 99% or less at the incident angle of 0 degrees for green light, and the distributed Bragg reflector formed in the red light emitting device 10a may have a reflectance of 99% or more at the incident angle of 0 degrees for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like and alloys thereof may be used.

Although the light emitting device 10a according to the exemplary embodiment has been briefly described with reference to FIGS. 2A-2B, the light emitting device 10a may further include a layer having additional functions in addition to the above-described layers. For example, various layers such as a reflection layer for reflecting light, an additional insulation layer for insulating a specific element, and/or a solder preventing layer for preventing diffusion of solder may be further included.

When a flip chip type light emitting device is formed, the mesa may be formed to have various shapes, and locations and shapes of the first and second electrode pads 61 and 63 may also be variously modified. In addition, the ohmic contact layer 27 may be omitted, and the second contact pad 55 or the second electrode pad 63 may directly contact the second conductivity type semiconductor layer 25.

Figure 3A:
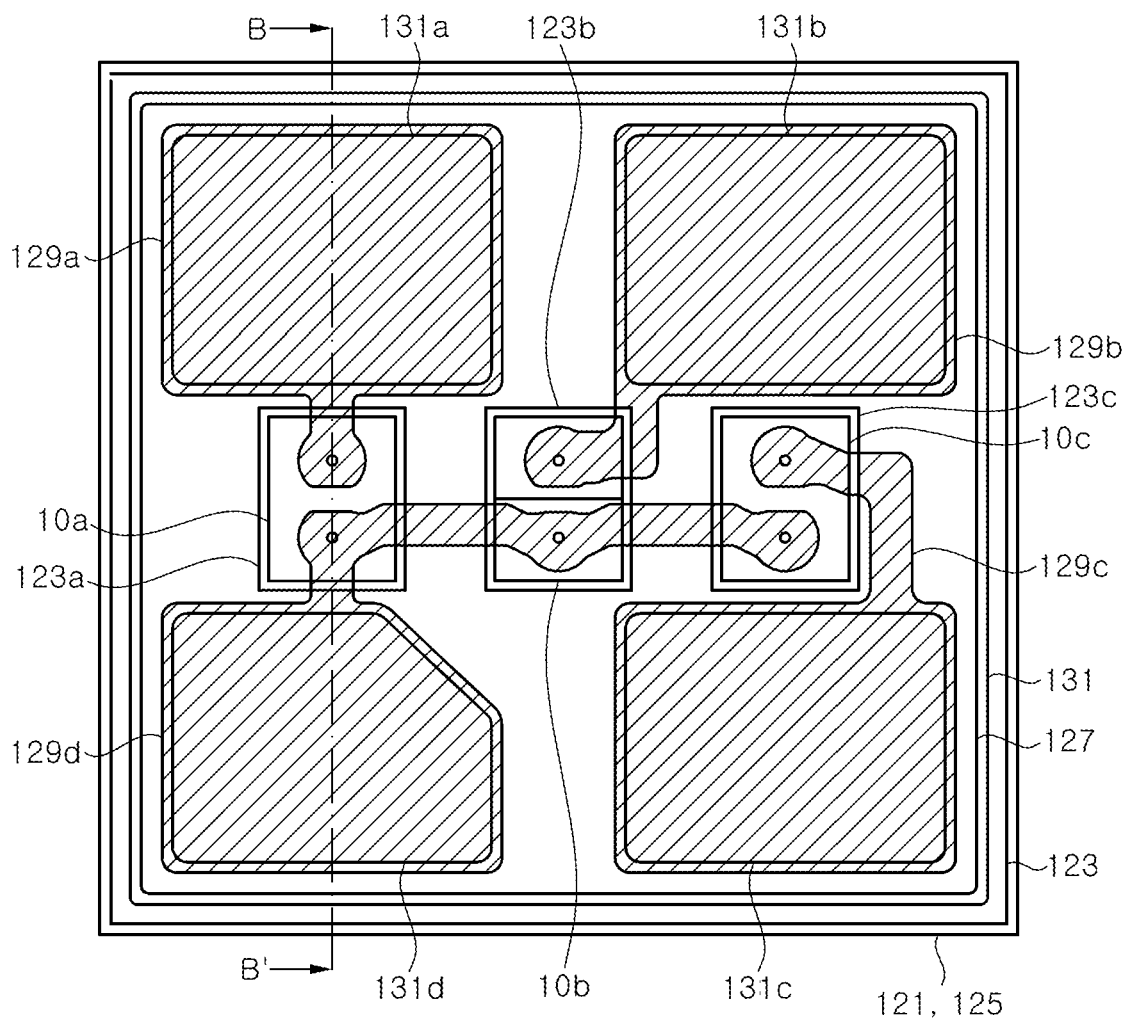
FIG. 3A is a schematic plan view illustrating a unit pixel according to an exemplary embodiment.
Figure 3B:
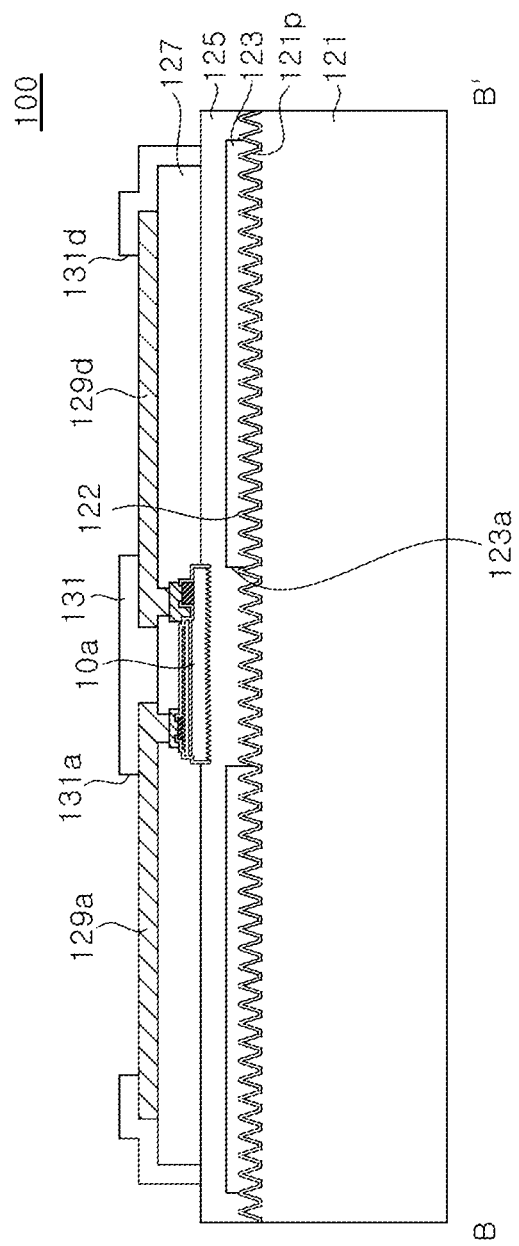
FIG. 3B is a schematic cross-sectional view taken along line B-B' of FIG. 3A.

FIG. 3A is a schematic plan view illustrating a unit pixel 100 according to an exemplary embodiment, and FIG. 3B is a schematic cross-sectional view taken along line B-B' of FIG. 3A.

Referring to FIGS. 3A and 3B, the unit pixel 100 may include a transparent substrate 121, a first, a second, and a third light emitting devices 10a, 10b, and 10c, a surface layer 122, a light blocking layer 123, an adhesive layer 125, a step adjustment layer 127, connection layers 129a, 129b, 129c, and 129d, and an insulation material layer 131

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus (10000 in FIG. 1), and light emitted from the light emitting devices 10a, 10b, and 10c is emitted to the outside through the transparent substrate 121. The transparent substrate 121 may have an upper surface and a lower surface. The transparent substrate 121 may include a concave-convex pattern 121p on a surface facing the light emitting devices 10a, 10b, and 10c, that is, the upper surface. The concave-convex pattern 121p scatters light emitted from the light emitting devices 10a, 10b, and 10c to increase a viewing angle. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concave-convex pattern 121p may be regular or irregular. The concave-convex pattern 121p may have a pitch of about 3 μm, a diameter of about 2.8 μm, and a height of about 1.8 μm, for example. The concave-convex pattern 121p may be a pattern generally applied to a patterned sapphire substrate, but the inventive concepts are not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

As the transparent substrate 121 is disposed on the light exiting surface, the transparent substrate 121 does not include a circuit. However, the inventive concepts are not limited thereto, and, in some exemplary embodiments, the transparent substrate 121 may include a circuit.

Although a single unit pixel 100 is illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121*p*. The surface layer 122 may improve adhesion of the light blocking layer 123 formed thereon (shown in FIG. 3C). For example, the surface layer 122 may be formed of a silicon oxide layer. In other forms, the surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10*a*, 10*b*, and 10*c* from leaking from a region between the transparent substrate 121 and the light emitting devices 10*a*, 10*b*, and 10*c* toward a side surface thereof, and may improve contrast of the displaying apparatus.

The light blocking layer 123 may have windows 123*a*, 123*b*, and 123*c* for a light path, so that light generated in the light emitting devices 10*a*, 10*b*, and 10*c* is incident on the transparent substrate 121, and for this purpose, the light blocking layer 123 on the transparent substrate 121 may be patterned to expose the transparent substrate 121. Widths of the windows 123*a*, 123*b*, and 123*c* may be narrower than those of the light emitting devices, but the inventive concepts are not limited thereto, and may be greater than or equal to those of the light emitting devices.

The window 123*a*, 123*b*, and 123*c* of the light blocking layer 123 also defines aligning locations of the light emitting devices 10*a*, 10*b*, and 10*c*. However, while the light emitting devices 10*a*, 10*b*, and 10*c* are mounted, the windows 123*a*, 123*b*, and 123*c* are covered by the light emitting devices 10*a*, 10*b*, and 10*c*, making it difficult to align the light emitting devices 10*a*, 10*b*, and 10*c*. The present disclosure provides a technique for facilitating alignment of the light emitting devices 10*a*, 10*b*, and 10*c*, which will be described in detail later with reference to FIG. 6.

The adhesive layer 125 is attached onto the transparent substrate 121. The adhesive layer 125 may cover the light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10*a*, 10*b*, and 10*c* to the transparent substrate 121. The adhesive layer 125 may fill the window 123*a*, 123*b*, and 123*c* formed in the light blocking layer 123.

The adhesive layer 125 may be formed as a light-transmitting layer, and transmits light emitted from the light emitting devices 10*a*, 10*b*, and 10*c*. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10*a*, 10*b*, and 10*c* from being observed from the light exiting surface.

Meanwhile, the first, second, and third light emitting devices 10*a*, 10*b*, and 10*c* are disposed on the transparent substrate 121. The first, second, and third light emitting devices 10*a*, 10*b*, and 10*c* may be attached to the transparent substrate 121 by the adhesive layer 125. The first, second, and third light emitting devices 10*a*, 10*b*, and 10*c* may be disposed corresponding to the windows 123*a*, 123*b*, and 123*c* of the light blocking layer 123.

The first, second, and third light emitting devices 10*a*, 10*b*, and 10*c* may be, for example, a red light emitting device, a green light emitting device, and a blue light emitting device. Since a detailed configuration of each of the first, second, and third light emitting devices 10*a*, 10*b*, and 10*c* is the same as described above with reference to FIGS. 2A and 2B, a detailed description thereof will be omitted.

The first, second, and third light emitting devices 10*a*, 10*b*, and 10*c* may be arranged in a line, as illustrated in FIG. 3A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10*a*, 10*b*, and 10*c*. For example, in FIG. 3A, the clean-cut surfaces (e.g., m-plane) may be disposed up and down, and the two remaining cut surfaces (e.g., a-plane) may be disposed left and right.

In addition, each of the first, second, and third light emitting devices 10*a*, 10*b*, and 10*c* may be arranged in parallel to one another in a major axis direction. Minor axis directions of the first, second, and third light emitting devices 10*a*, 10*b*, and 10*c* may coincide with an arrangement direction of the light emitting devices.

The first, second, and third light emitting devices 10*a*, 10*b*, and 10*c* may have been those described above with reference to FIGS. 2A and 2B, but the inventive concepts are not limited thereto, and various light emitting devices of a lateral type or a flip-chip structure may be used.

The step adjustment layer 127 covers the first, second, and third light emitting devices 10*a*, 10*b*, and 10*c*. The step adjustment layer 127 has openings 127*a* exposing the first and second electrode pads 61 and 63 of the light emitting devices 10*a*, 10*b*, and 10*c*. The step adjustment layer 127 assists to securely form the connection layers by uniformly adjusting elevations of surfaces on which the connection layers 129*a*, 129*b*, 129*c*, and 129*d* are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

The first, second, third, and fourth connection layers 129*a*, 129*b*, 129*c*, and 129*d* are formed on the step adjustment layer 127. The connection layers 129*a*, 129*b*, 129*c*, and 129*d* may be connected to the first and second electrode pads 61 and 63 of the first, second, and third light emitting devices 10*a*, 10*b*, and 10*c* through the openings 127*a* (shown in FIG. 5D) of the step adjustment layer 127.

In an exemplary embodiment, as illustrated in FIGS. 3A and 3B, the first connection layer 129*a* may be electrically connected to a second conductivity type semiconductor layer of the first light emitting device 10*a*, the second connection layer 129*b* may be electrically connected to a second conductivity of the second light emitting device 10*b*, the third connection layer 129*c* may be electrically connected to a second conductivity type semiconductor layer of the third light emitting device 10*c*, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may include, for example, Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and about 50 μm or less, but the inventive concepts are not limited thereto.

The insulation material layer 131 covers side surfaces of the step adjustment layer 127 and the connection layers 129a, 129b, 129c, and 129d. In addition, the insulation material layer 131 may cover a portion of the adhesive layer 125. The insulation material layer 131 may have openings 131a, 131b, 131c, and 131d exposing the connection layers 129a, 129b, 129c, and 129d, and accordingly, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129a, 129b, 129c, and 129d may be surrounded by the polyimide, except for the pad regions.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

According to the illustrated exemplary embodiment, the unit pixel 100 does not include separate bumps, and the connection layers 129a, 129b, 129c, and 129d are used as bonding pads. The inventive concepts are not limited thereto, and bonding pads covering the openings 131a, 131b, 131c, and 131d of the insulation material layer 131 may be formed. In an exemplary embodiment, the bonding pads may be formed to partially cover the light emitting devices 10a, 10b, and 10c outside of upper regions of the first, second, third, and fourth connection layers 129a, 129b, 129c, and 129d.

In the illustrated exemplary embodiment, the light emitting devices 10a, 10b, and 10c are described as being attached to the transparent substrate 121 by the adhesive layer 125, but the light emitting devices 10a, 10b, and 10c may be coupled to the transparent substrate 121 using another coupler instead of the adhesive layer 125. For example, the light emitting devices 10a, 10b, and 10c may be coupled to the transparent substrate 121 using spacers, and thus, gas or liquid may be filled in a region between the light emitting devices 10a, 10b, and 10c and the transparent substrate 121. An optical layer that transmits light emitted from the light emitting devices 10a, 10b, and 10c may be formed by the gas or liquid. The adhesive layer 125 described above is also an example of the optical layer. Herein, the optical layer is formed of a material such as gas, liquid, or solid, different from those of the light emitting devices 10a, 10b, and 10c, and thus, is distinguished from the materials of the semiconductor layers in the light emitting devices 10a, 10b, and 10c.

Figure 4A:
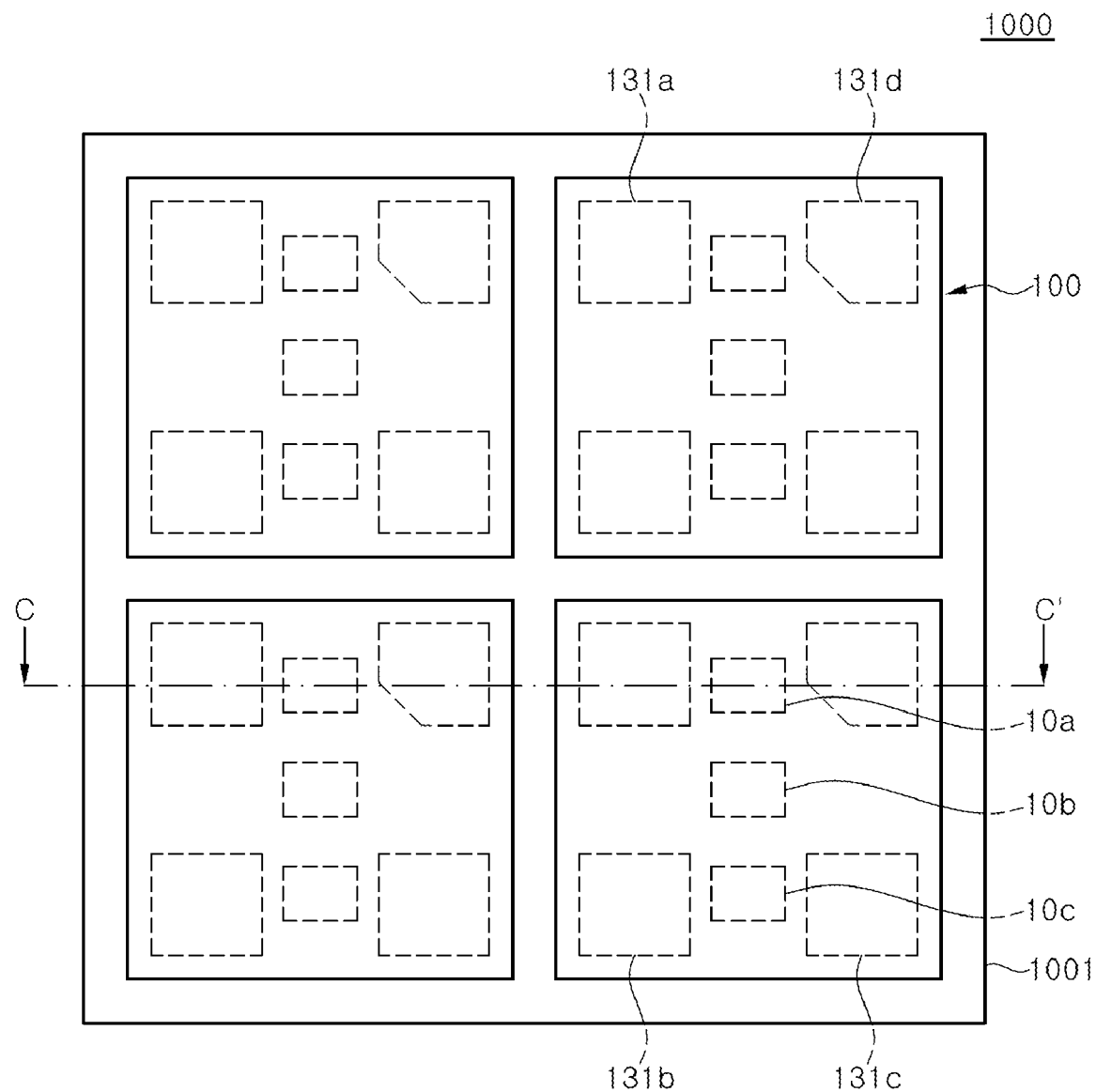
FIG. 4A is a schematic plan view illustrating a pixel module according to an exemplary embodiment.
Figure 4B:
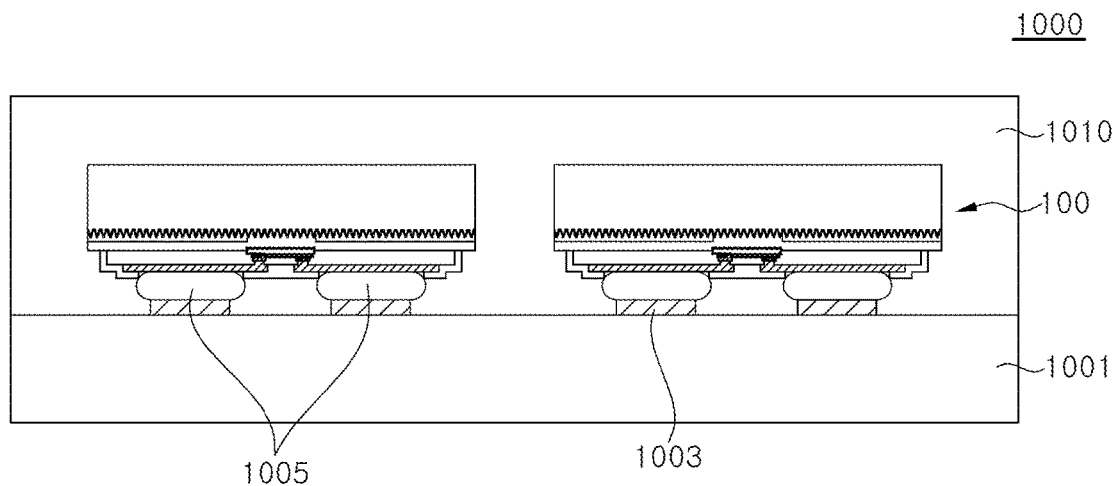
FIG. 4B is a schematic cross-sectional view taken along line C-C' of FIG. 4A.

FIG. 4A is a schematic plan view illustrating a pixel module 1000 according to an exemplary embodiment, and FIG. 4B is a schematic cross-sectional view taken along line C-C' of FIG. 4A.

Referring to FIGS. 4A and 4B, the pixel module 1000 includes a circuit board 1001 and unit pixels 100 arranged on the circuit board 1001. Furthermore, the pixel module 1000 may further include a cover layer 1010 covering the unit pixels 100.

The circuit board 1001 may include a circuit for electrically connecting a panel substrate 2100 and light emitting devices 10a, 10b, and 10c. A circuit in the circuit board 1001 may be formed in a multi-layered structure. The circuit board 1001 may also include a passive circuit for driving the light emitting devices 10a, 10b, and 10c in a passive matrix driving manner or an active circuit for driving the light emitting devices 10a, 10b, and 10c in an active matrix driving manner. The circuit board 1001 may include pads 1003 exposed on a surface thereof.

Since a detailed configuration of the unit pixels 100 is the same as described above with reference to FIGS. 3A and 3B, a detailed description thereof will be omitted to avoid redundancy. The unit pixels 100 may be arranged on the circuit board 1001. The unit pixels 100 may be arranged in a 2×2 matrix as shown in FIG. 4A, but the inventive concepts are not limited thereto, and may be arranged in various matrices such as 2×2, 3×3, 5×5, or the like.

The unit pixels 100 are bonded to the circuit board 1001 through a bonding material 1005. For example, the bonding material 1005 bonds connection layers 229a, 229b, 229c, and 229d exposed through the openings 131a of the insulation material layer 131 described with reference to FIGS. 3A and 3B to the pads 1003 on the circuit board 1001. For example, the bonding material 1005 may be solder, and after a solder paste is disposed on the pads 1003 on the circuit board 1001 using a technology such as screen printing, the unit pixel 100 and the circuit board 1001 may be bonded through a reflow process.

According to the illustrated exemplary embodiment, the bonding material 1005 having a single structure may be disposed between the connection layers 129a, 129b, 129c, and 129d and the pads 1003, and the bonding material 1005 may directly connect the connection layers 129a, 129b, 129c, and 129d and the pads 1003.

The cover layer 1010 covers the unit pixels 100. The cover layer 1010 may improve contrast of a displaying apparatus 10000 by preventing optical interference between the unit pixels 100.

The cover layer 1010 may be formed of, for example, a dry-film type solder resist (DFSR), a photoimageable solder resist (PSR), a black material (BM), an epoxy molding compound (EMC), or the like. The cover layer 1010 may be formed using, for example, a technique such as lamination, spin coating, slit coating, printing, or the like.

The displaying apparatus 10000 may be provided by mounting the pixel modules 1000 shown in FIGS. 4A and 4B on the panel substrate 2100 of FIG. 1. The circuit board 1001 has bottom pads connected to the pads 1003. The bottom pads may be disposed to correspond to the pads 1003 one-to-one, but the number of the bottom pads may be reduced through a common connection.

In the illustrated exemplary embodiment, the unit pixels 100 may be formed into the pixel module 1000, and the pixel modules 1000 may be mounted on the panel substrate 2100, thereby providing the displaying apparatus 10000, accordingly, a process yield of the displaying apparatus 10000 may be improved. However, the inventive concepts are not limited thereto, and the unit pixels 100 may be mounted directly on the panel substrate 2100.

FIGS. 5A through 5E are schematic cross-sectional views illustrating a method of fabricating a unit pixel 100 according to an exemplary embodiment.

Figure 5A:
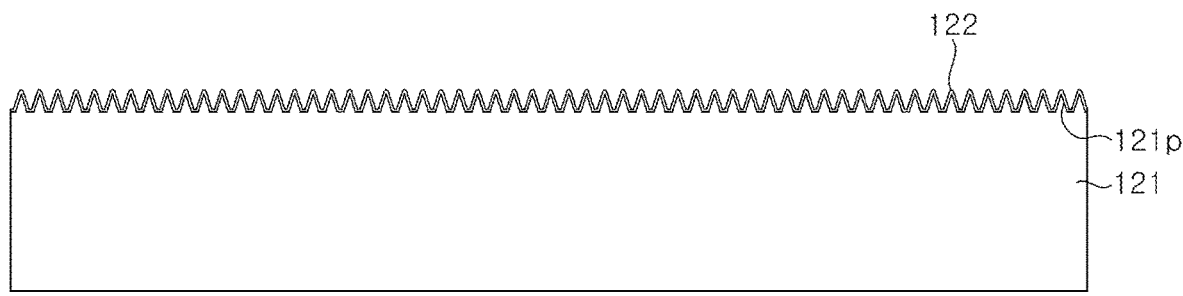
FIGS. 5A through 5E are schematic cross-sectional views illustrating a method of fabricating a unit pixel according to an exemplary embodiment, where.

First, referring to FIG. 5A, a concave-convex pattern 121*p* is formed on an upper surface of a transparent substrate 121. The transparent substrate 121 is a light transmissive substrate such as PET, glass substrate, quartz, sapphire substrate, or the like. In an exemplary embodiment, the concave-convex pattern 121*p* may be formed by etching the surface of the transparent substrate 121 using a dry or wet etching technique.

A surface layer 122 may be formed on the transparent substrate 121. The surface layer 122 may be formed along the concave-convex pattern 121*p*. For example, the surface layer 122 may be formed of a silicon oxide layer. The surface layer 122 is formed to modify the surface of the transparent substrate 121, and may be omitted.

Figure 5B:
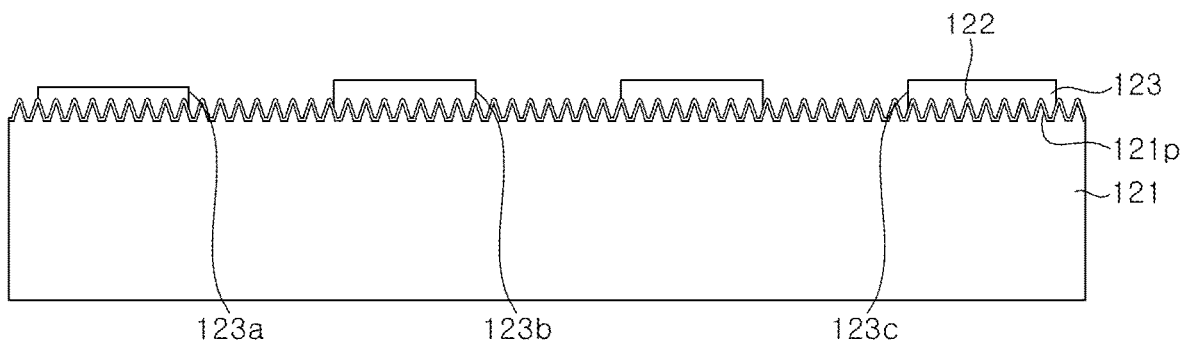

Referring to FIGS. 3A and 5B, a light blocking layer 123 is formed on the transparent substrate 121. The light blocking layer 123 may be formed of a light absorbing material layer, for example, a black matrix including a light absorbing material such as carbon black. The light blocking layer 123 may also be formed of a photosensitive material layer and patterned by exposure and development. Windows 123*a*, 123*b*, and 123*c* may be formed by patterning the light blocking layer 123. A plurality of windows 123*a*, 123*b*, and 123*c* may be formed corresponding to the light emitting devices 10*a*, 10*b*, and 10*c*, and the windows 123*a*, 123*b*, and 123*c* may be spaced apart from one another.

Although a cross-section of one unit pixel region is illustrated in the illustrated exemplary embodiment, the transparent substrate 121 may be a substrate having a larger area with a diameter of, for example, 4 inches, 6 inches, 8 inches, or the like. The unit pixel region may have, for example, an area of 400 nm×400 nm or less, or further, 240 nm×240 nm or less, and thus, the light blocking layer 123 may be formed on the transparent substrate 121 to define a plurality of unit pixel regions. The windows 123*a*, 123*b*, and 123*c* are formed in each of the unit pixel regions.

Figure 6:
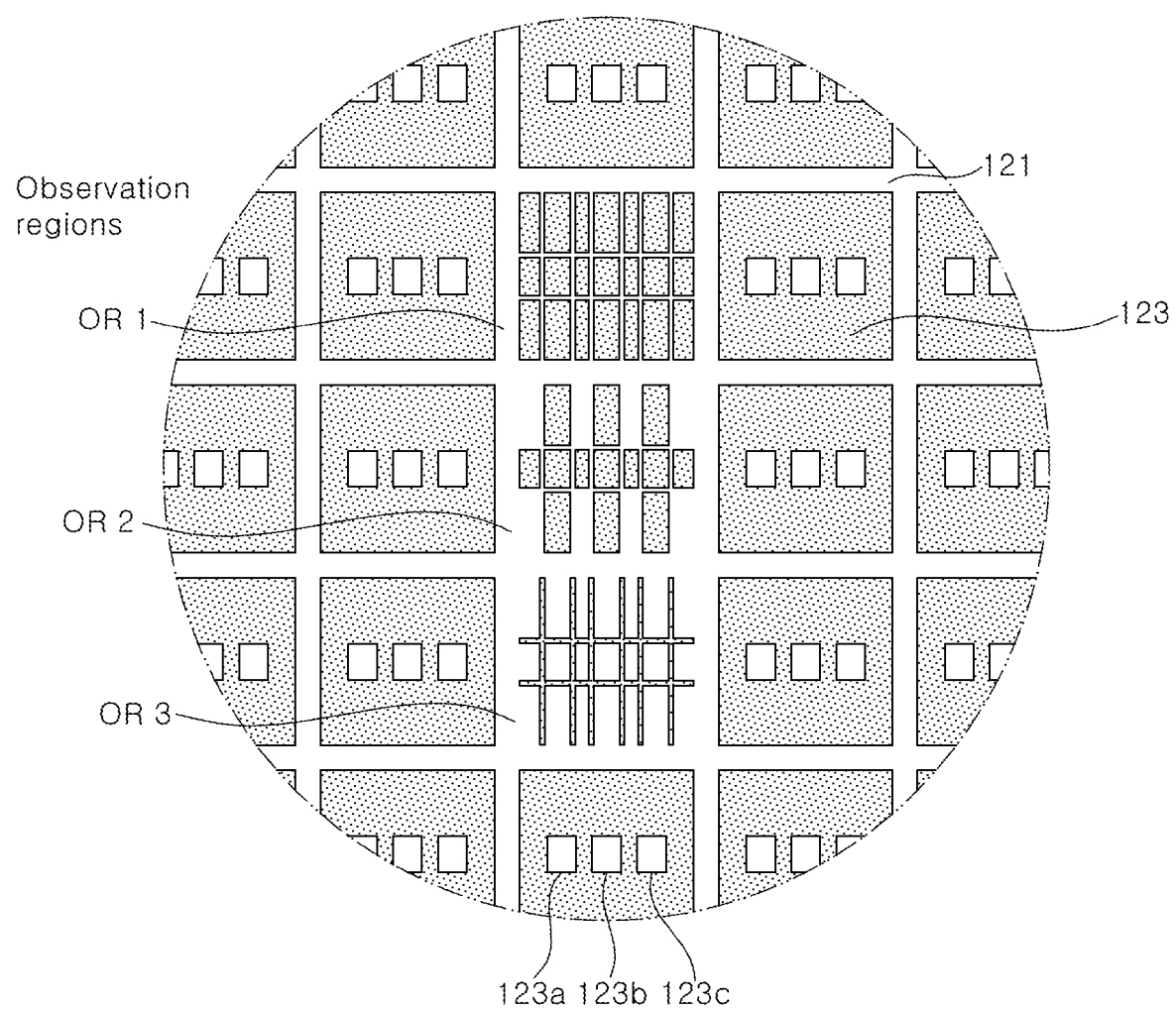
FIG. 6 is a schematic plan view illustrating a wafer having a light blocking layer pattern.

In addition, the light blocking layer 123 may be patterned to define an observation region for checking alignment of the light emitting devices 10*a*, 10*b*, and 10*c*. The observation region includes a region and an auxiliary pattern for mounting the light emitting devices. As shown in FIG. 6, the unit pixel regions and the observation regions may be divided by a scribing line. The observation region of the light blocking layer 123 will be described in detail later with reference to FIG. 6.

Figure 5C:
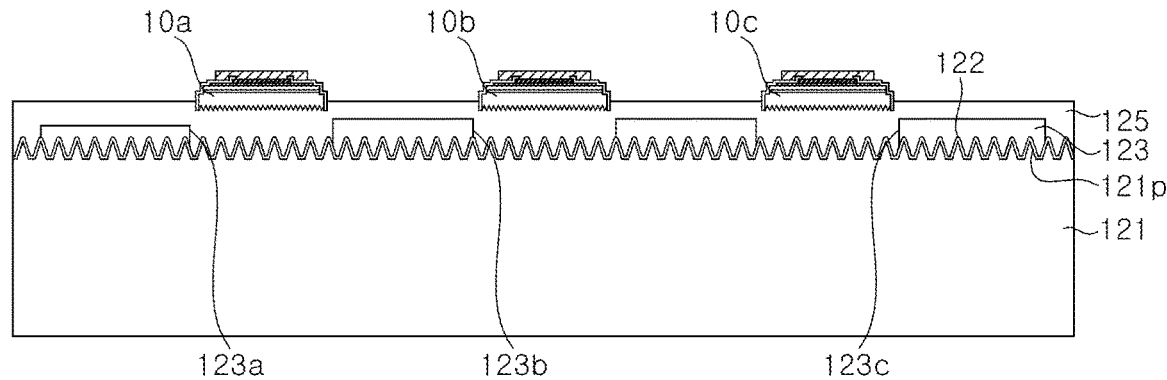

Referring to FIGS. 3A and 5C, an adhesive layer 125 may be formed on the light blocking layer 123. The adhesive layer 125 may cover the light blocking layer 123, and may also cover the surface layer 122 or the transparent substrate 121 exposed through the windows 123*a*, 123*b*, and 123*c* formed in the light blocking layer 123.

The adhesive layer 125 may be formed on an entire surface of the transparent substrate 121, but the inventive concepts are not limited thereto, and, in some exemplary embodiments, the adhesive layer 125 may be formed on a portion of the transparent substrate 121 to expose a region near an edge of the transparent substrate 121. The adhesive layer 125 is used to attach the light emitting devices 10*a*, 10*b*, and 10*c* to the transparent substrate 121. The adhesive layer 125 may be formed as a light-transmitting layer, and transmits light emitted from the light emitting devices 10*a*, 10*b*, and 10*c*. The adhesive layer 125 may be formed using an adhesive sheet or an organic adhesive. For example, the adhesive layer 125 may be formed using a transparent epoxy. In an exemplary embodiment, the adhesive layer 125 may include a diffuser such as $SiO_2$, $TiO_2$, ZnO, or the like to diffuse light. The light diffusing material prevents the light emitting devices 10*a*, 10*b*, and 10*c* from being observed from the light exiting surface. As shown in FIG. 5C, the adhesive layer 125 may cover a side surface of the light blocking layer 123.

Subsequently, the light emitting devices 10*a*, 10*b*, and 10*c* are disposed on the adhesive layer 125. The light emitting devices 10*a*, 10*b*, and 10*c* may be transferred to the adhesive layer 125 using a transferring process. A plurality of unit pixel regions may be defined on the transparent substrate 121, the light emitting devices 10*a*, the light emitting devices 10*b*, and the light emitting devices 10*c* may be transferred through a separate process, and the light emitting devices 10*a*, 10*b*, and 10*c* may be transferred together. It may be observed whether or not the light emitting devices 10*a*, 10*b*, and 10*c* are favorably arranged through the observation region while the light emitting devices 10*a*, 10*b*, and 10*c* are transferred, and also, degrees to which locations of the light emitting devices 10*a*, 10*b*, and 10*c* deviate from their correct locations may be measured after the light emitting devices 10*a*, 10*b*, and 10*c* are transferred.

The light emitting devices 10*a*, 10*b*, and 10*c* may be disposed corresponding to the windows 123*a*, 123*b*, and 123*c*, respectively. The light emitting devices 10*a*, 10*b*, and 10*c* may have a size smaller than that of the windows 123*a*, 123*b*, and 123*c* and may be located in upper regions of the windows 123*a*, 123*b*, and 123*c*, respectively. In another exemplary embodiment, the light emitting devices 10*a*, 10*b*, and 10*c* may have a larger area than that of the windows 123*a*, 123*b*, and 123*c*, respectively.

Figure 5D:
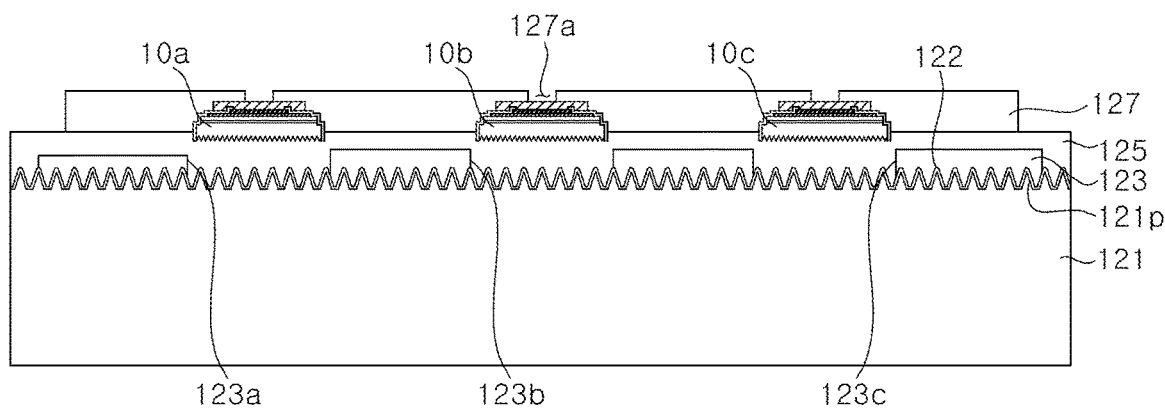

Referring to FIGS. 3A and 5D, a step adjustment layer 127 is formed to cover the light emitting devices 10*a*, 10*b*, and 10*c*. The step adjustment layer 127 may be formed of, for example, photosensitive polyimide, and may be patterned using exposure and development techniques.

For example, the step adjustment layer 127 may have openings 127*a* exposing the light emitting devices 10*a*, 10*b*, and 10*c*. For example, the openings 127*a* of the step adjustment layer 127 may expose first and second electrode pads (61 and 63 of FIG. 2B.) Furthermore, the step adjustment layer 127 may be removed along the edge of the transparent substrate 121 to expose the adhesive layer 125.

Figure 5E:
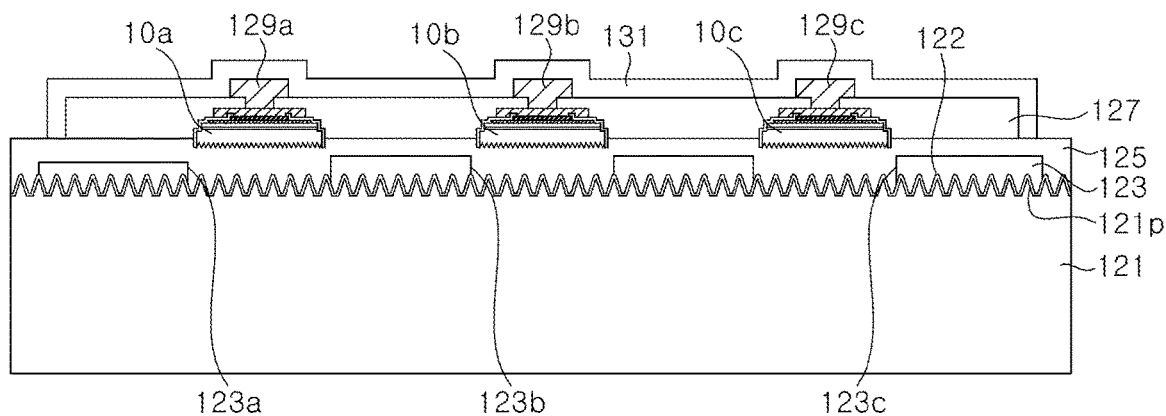

Referring to FIGS. 3A and 5E, first, second, third, and fourth connection layers 129*a*, 129*b*, 129*c*, and 129*d* are formed on the step adjustment layer 127. For example, the first, second, third, and fourth connection layers 129*a*, 129*b*, 129*c*, and 129*d* may be formed using a lift-off technology.

The connection layers 129*a*, 129*b*, 129*c*, and 129*d* may be connected to the light emitting devices 10*a*, 10*b*, and 10*c* through the openings 127*a* of the step adjustment layer 127.

For example, the first, second, and third connection layers 129a, 129b, and 129c may be electrically connected to first conductivity type semiconductor layers of the light emitting devices 10a, 10b, and 10c, respectively, and the fourth connection layer 129d may be electrically connected to second conductivity type semiconductor layers of the light emitting devices 10a, 10b, and 10c.

Subsequently, an insulation material layer 131 may be formed. The insulation material layer 131 covers the first, second, third, and fourth connection layers 129a, 129b, 129c, and 129d. The insulation material layer 131 may have openings 131a, 131b, 131c, and 131d exposing the first, second, third, and fourth connection layers 129a, 129b, 129c, and 129d as shown in FIG. 3A, pad regions may be defined by the openings 131a, 131b, 131c, and 131d.

FIG. 6 is a schematic plan view illustrating a wafer having a light blocking layer pattern according to an exemplary embodiment. Herein, FIG. 6 is a partial plan view of a light blocking layer 123 disposed on a transparent substrate 121 having a larger area.

Referring to FIG. 6, the light blocking layer 123 is patterned to define unit pixel regions and observation regions (OR1, OR2, OR3). The unit pixel regions include mounting regions for mounting light emitting devices 10a, 10b, and 10c, for example, windows from which the light blocking layer 123 is removed. Meanwhile, the observation regions (OR1, OR2, OR3) include auxiliary patterns and mounting regions for mounting the light emitting devices. The light emitting device mounting region in the observation region may be a window from which the light blocking layer 123 is removed, or may be an island of the light blocking layer 123.

The observation region may be disposed in a central region on the transparent substrate 121, but the inventive concepts are not limited thereto. For example, the observation region may be disposed near a corner of the transparent substrate 121. In addition, observation regions may be disposed at positions diagonal to each other on the transparent substrate, and alignment and parallel structure between the light emitting devices 10a, 10b, and 10c and the transparent substrate 121 may be adjusted during transfer through a plurality of observation regions. A plurality of observation regions (OR1, OR2, OR3) may be disposed adjacent to one another as shown in FIG. 6. Since the observation regions are disposed adjacent to one another, an operator may precisely mount the light emitting devices on correct locations using the adjacent observation regions. As illustrated, three observation regions may be arranged in a line. In an exemplary embodiment, the observation regions may be disposed adjacent to one another along a major axis direction of the light emitting device.

The auxiliary patterns in the adjacent observation regions (OR1, OR2, OR3) may be identical to one another or different from one another. The observation regions (OR1, OR2, OR3) shown in FIG. 6 show different auxiliary patterns from one another. However, the inventive concepts are not limited thereto, and the adjacent observation regions may have identical auxiliary patterns to one another.

Figure 7A:
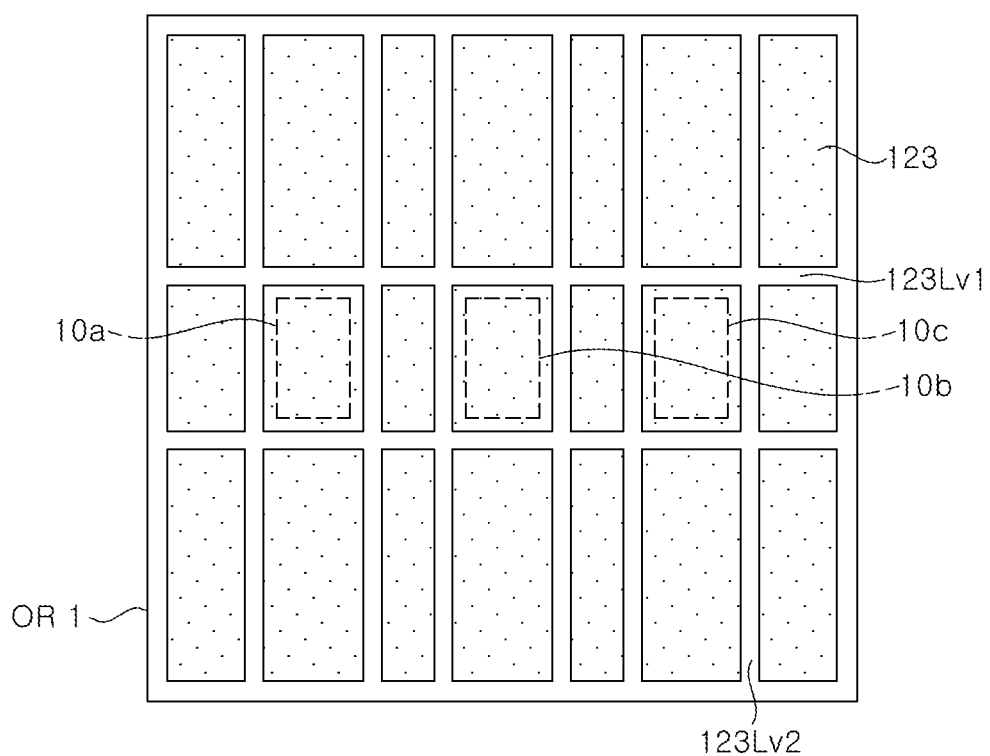
FIG. 7A is a schematic plan view illustrating an observation region of a light blocking layer according to an exemplary embodiment.
Figure 7B:
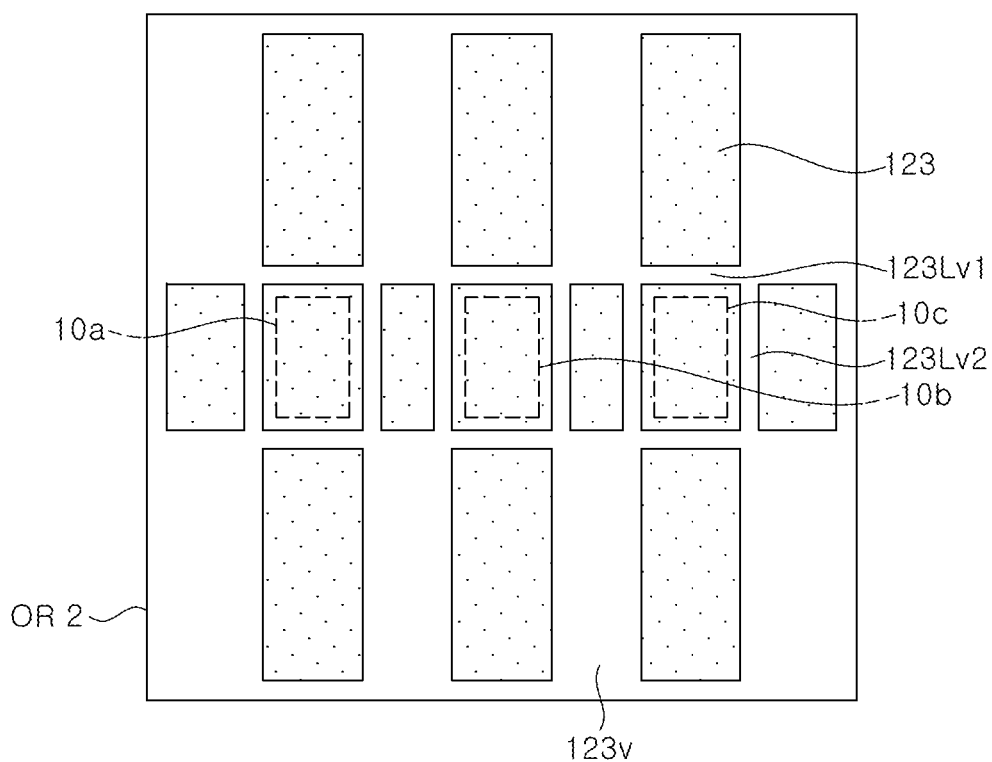
FIG. 7B is a schematic plan view illustrating an observation region of a light blocking layer according to an exemplary embodiment.
Figure 7C:
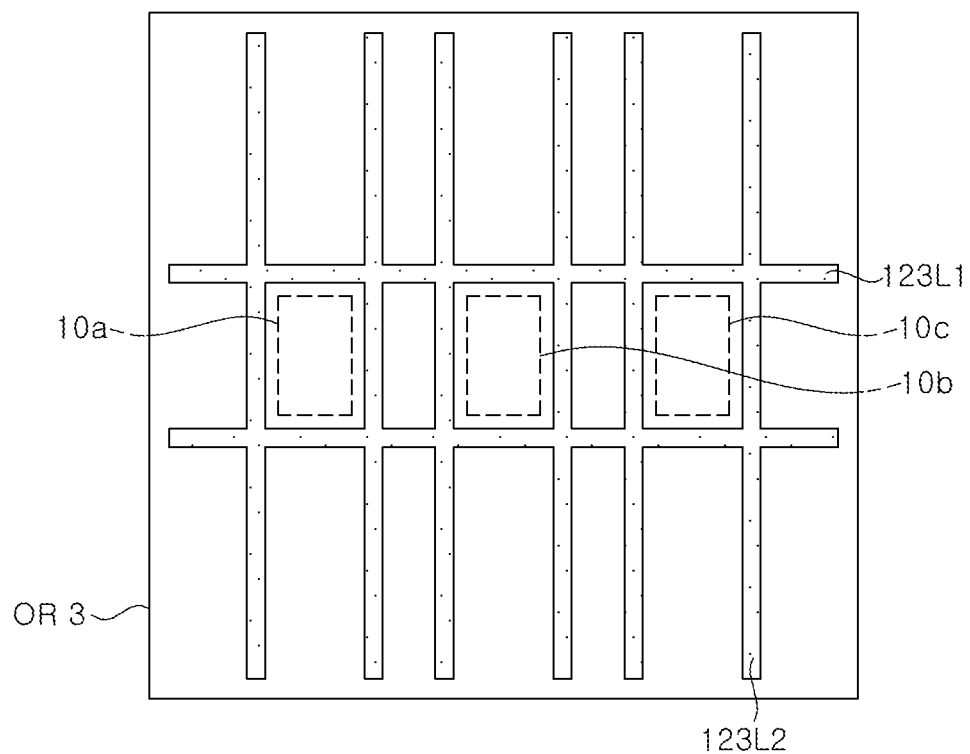
FIG. 7C is a schematic plan view illustrating an observation region of a light blocking layer according to an exemplary embodiment.

An exemplary embodiment of the observation regions will be described in detail with reference to FIGS. 7A, 7B, and 7C. FIGS. 7A, 7B, and 7C are schematic enlarged plan views illustrating the observation regions (OR1, OR2, OR3) shown in FIG. 6, respectively.

Referring to FIG. 7A, light emitting device mounting regions are defined as islands of the light blocking layer 123, and a line-shaped auxiliary pattern including lines 123Lv1 and 123Lv2 is formed along edges of the light emitting device mounting regions. The light emitting devices 10a, 10b, and 10c are shown to indicate the light emitting device mounting regions. Sizes of the light emitting devices 10a, 10b, and 10c may be smaller than those of the light emitting device mounting regions as illustrated, but the inventive concepts are not limited thereto. For example, the light emitting devices 10a, 10b, and 10c may have areas identical to those of the light emitting device mounting regions or areas larger than those of the light emitting device mounting regions. Herein, lines 123Lv1 and 123Lv2 may be formed in intaglio by removing the light blocking layer 123. Remaining portions other than the auxiliary patterns 123Lv1 and 123Lv2 in the observation region may be covered with the light blocking layer 123.

Meanwhile, as shown in FIG. 7A, islands having narrower widths than those of the light emitting device mounting region may be formed between the light emitting device mounting regions by the lines 123Lv1 and 123Lv2, and islands having the same widths as those of the islands having the narrower widths may be formed on upper and lower sides of the islands having the narrower widths. In addition, islands having the same width as that of the light emitting device mounting region may be disposed upper and lower regions of the light emitting device mounting region.

Referring to FIG. 7B, an observation region OR2 according to the illustrated exemplary embodiment is substantially similar to the observation region OR1 described with reference to FIG. 7A, but there is a difference in that the remaining islands are removed except for the light emitting device mounting regions and the islands of the light blocking layer disposed adjacent thereto. Accordingly, empty regions 123v without the light blocking layer 123 are formed.

Referring to FIG. 7C, in an observation region OR3 according to the present exemplary embodiment, light emitting device mounting regions are formed by windows where the light blocking layer is removed, and an auxiliary pattern formed in embossing of the light blocking layer 123 around the light emitting device regions is disposed. That is, lines 123L1 and 123L2 are formed as the light blocking layer 123, and the light blocking layer 123 around the lines 123L1 and 123L2 is removed.

When the light emitting devices 10a, 10b, and 10c are mounted, by using the auxiliary pattern, the light emitting devices 10a, 10b, and 10c may be easily mounted in correct locations. As the light emitting devices 10a, 10b, and 10c are properly mounted on the correct locations in the observation regions, light emitting devices 10a, 10b, and 10c even in other unit pixel regions may be mounted at the correct locations. In addition, after the light emitting devices 10a, 10b, and 10c are mounted, degrees to which the light emitting devices 10a, 10b, and 10c deviate from their correct locations may be easily checked using the auxiliary pattern.

Furthermore, even when the adhesive layer 125 formed on the light blocking layer 123 to mount the light emitting devices 10a, 10b, and 10c is deformed, the auxiliary pattern of the light blocking layer 123 may not be deformed, and thus the light emitting devices 10a, 10b, and 10c may be precisely mounted regardless of the deformation of the adhesive layer 125, and the degree of deviation may be precisely measured.

Figure 8:
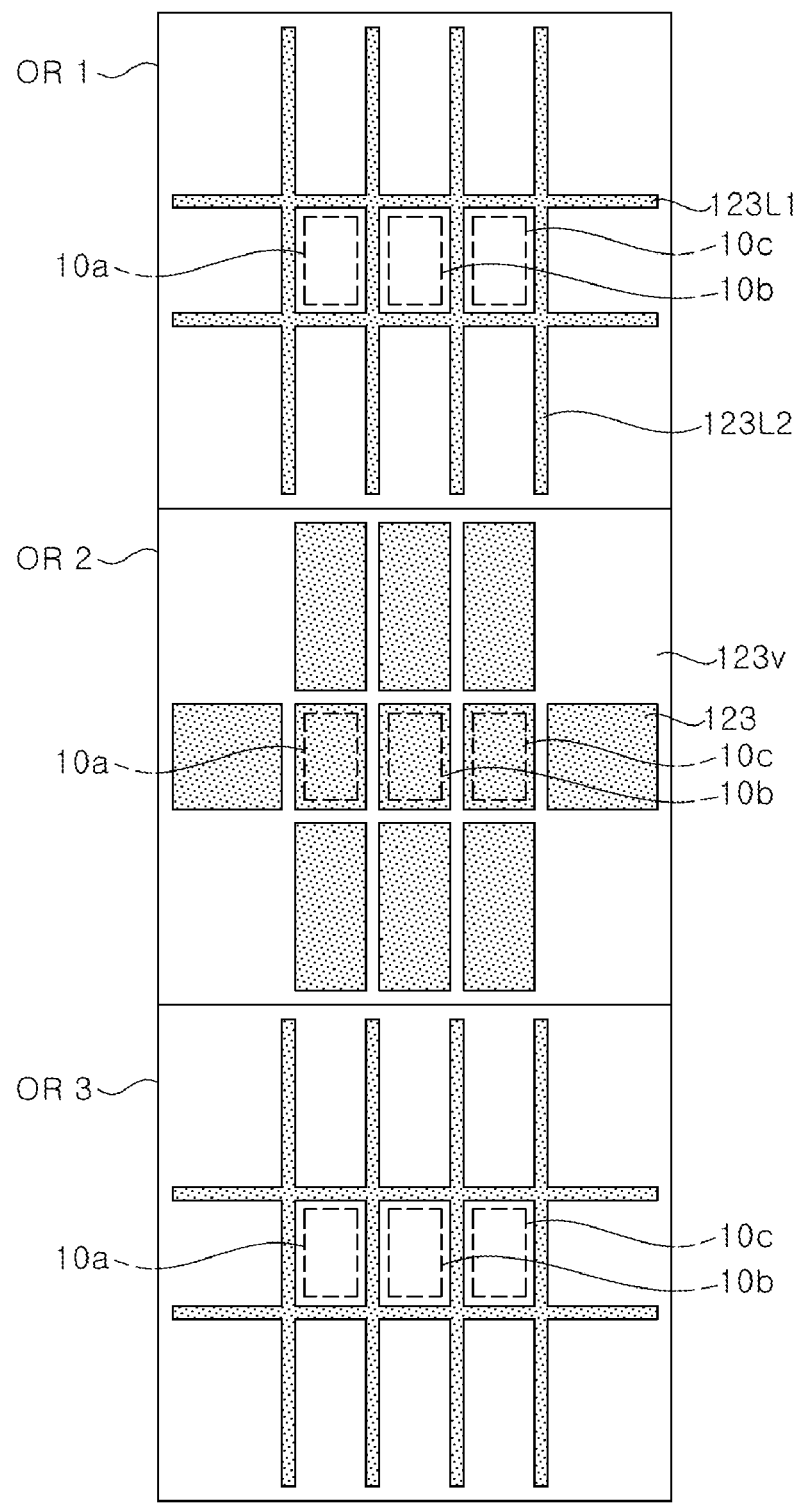
FIG. 8 is a schematic plan view illustrating observation regions of a light blocking layer according to an exemplary embodiment.

FIG. 8 is a schematic plan view illustrating observation regions OR1, OR2, and OR3 of a light blocking layer according to an exemplary embodiment.

Referring to FIG. 8, observation regions OR1, OR2, and OR3 according to the illustrated exemplary embodiment have a size relatively smaller than that of the observation regions described with reference to FIGS. 7A, 7B, and 7C, respectively. According to the illustrated exemplary embodiment, the observation regions used for manufacturing a smaller unit pixel are described.

As the size of the observation region decreases, a distance between mounting regions for mounting light emitting devices 10a, 10b, and 10c becomes smaller. Accordingly, the distance between the light emitting device mounting regions is defined by an intaglio or embossed line.

The observation regions OR1 and OR3 have an identical auxiliary pattern of embossed lines 123L1 and 123L2, and the observation region OR2 has an auxiliary pattern in which islands of a light blocking layer are disposed adjacent to the light emitting device mounting regions. Most of the auxiliary patterns of the observation region OR2 are formed of intaglio lines, but an empty area 123v without a light blocking layer may be partially disposed on the observation region OR2.

In the illustrated exemplary embodiment, although it has been described that the observation regions in OR1 and OR3 have the identical auxiliary pattern, the inventive concepts are not limited thereto, and the observation regions in OR1 and OR3 may have different auxiliary patterns from each other.

Meanwhile, in the illustrated exemplary embodiment, although it has been exemplarily described that the auxiliary pattern is formed of the intaglio or embossed lines or the islands, but the inventive concepts are not limited thereto, and auxiliary patterns of various shapes may be used.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:

1. A wafer for fabricating a unit pixel, the wafer comprising:
a transparent substrate; and
a light blocking layer disposed on the transparent substrate, wherein:
the light blocking layer includes a plurality of unit pixel regions and a plurality of observation regions including an observation region;
each of the plurality of unit pixel regions has a first mounting region configured to mount a light emitting device; and
the observation region includes a second mounting region configured to mount the light emitting device and an auxiliary pattern disposed around the second mounting region,
wherein the auxiliary pattern comprises an intaglio or embossed line,
wherein the plurality of observation regions is disposed adjacent to one another, and two or more of the plurality of observation regions have different auxiliary patterns from one another.

2. The wafer of claim 1,
wherein the two or more of the plurality of observation regions, arranged to be adjacent to one another, have different auxiliary patterns from one another.

3. The wafer of claim 1,
wherein at least one of the plurality of unit pixel regions and the observation region include three light emitting device mounting regions, respectively.

4. A wafer for fabricating a unit pixel, the wafer comprising:
a transparent substrate; and
a light blocking layer disposed on the transparent substrate, wherein:
the light blocking layer includes a plurality of unit pixel regions and at least one observation region;
each of the plurality of unit pixel regions has a first mounting region configured to mount a light emitting device; and
the at least one observation region includes a second mounting region configured to mount the light emitting device and an auxiliary pattern disposed around the second mounting region,
wherein the auxiliary pattern comprises an intaglio or embossed line,
wherein the wafer further comprises:
an adhesive layer covering the light blocking layer; and
light emitting devices disposed on the adhesive layer, wherein:
the adhesive layer covers the plurality of unit pixel regions and the at least one observation region, and
the light blocking layer further includes first light emitting device mounting regions in the plurality of unit pixel regions and second light emitting device mounting regions in the at least one observation region.

5. The wafer of claim 1,
wherein the auxiliary pattern further includes island structures patterned from the light blocking layer and disposed adjacent to the second mounting region.

6. The wafer of claim 3,
wherein the at least one of the plurality of unit pixel regions includes three windows respectively corresponding to the three light emitting device mounting regions.

7. The wafer of claim 6,
wherein the observation region includes three windows corresponding to the three light emitting device mounting regions or island patterns from the light blocking layer.

8. The wafer of claim 4, wherein the light blocking layer includes a plurality of observation regions disposed adjacent to one another.

9. The wafer of claim 4, wherein at least one of the plurality of unit pixel regions and the at least one observation region include three light emitting device mounting regions, respectively.

10. The wafer of claim 4, wherein the auxiliary pattern further includes island structures patterned from the light blocking layer and disposed adjacent to the second mounting region.

11. A wafer for fabricating a unit pixel, the wafer comprising:
a transparent substrate; and
a light blocking layer disposed on the transparent substrate, wherein:
the light blocking layer includes a plurality of unit pixel regions and at least one observation region;
each of the plurality of unit pixel regions has a first mounting region configured to mount a light emitting device; and
the at least one observation region includes a second mounting region configured to mount the light emitting device and an auxiliary pattern disposed around the second mounting region, and wherein the auxiliary pattern further includes island structures patterned from the light blocking layer and disposed adjacent to the second mounting region.

12. The wafer of claim 11, wherein the light blocking layer includes a plurality of observation regions disposed adjacent to one another.

13. The wafer of claim 12, wherein the plurality of observation regions is arranged to be adjacent to one another and two or more of the plurality of observation regions have different auxiliary patterns from one another.

14. The wafer of claim 13, wherein the two or more of the plurality of observation regions, arranged to be adjacent to one another, have different auxiliary patterns from one another.

15. The wafer of claim 11, further comprising:
an adhesive layer covering the light blocking layer; and
light emitting devices disposed on the adhesive layer.

16. The wafer of claim 15, wherein:
the adhesive layer covers the plurality of unit pixel regions and the at least one observation region, and
the light blocking layer further includes first light emitting device mounting regions in the plurality of unit pixel regions and second light emitting device mounting regions in the at least one observation region.

17. The wafer of claim 11, wherein at least one of the plurality of unit pixel regions and the at least one observation region include three light emitting device mounting regions, respectively.

18. The wafer of claim 17, wherein the at least one of the plurality of unit pixel regions includes three windows respectively corresponding to the three light emitting device mounting regions.

19. The wafer of claim 18, wherein the at least one observation region includes three windows corresponding to the three light emitting device mounting regions or island patterns from the light blocking layer.

* * * * *